US006784700B1

(12) United States Patent
Hunt et al.

(10) Patent No.: US 6,784,700 B1
(45) Date of Patent: Aug. 31, 2004

(54) INPUT BUFFER CIRCUIT

(75) Inventors: Jeffrey Scott Hunt, Ackerman, MS (US); Satish Chandra Saripella, Addison, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/233,696

(22) Filed: Sep. 3, 2002

(51) Int. Cl.[7] ................................ H03B 1/00

(52) U.S. Cl. ........................ 327/108; 327/333; 326/81

(58) Field of Search ........................ 327/108–112, 309, 327/313, 170, 333, 389, 391, 65, 70, 77, 562, 563, 427, 318, 319, 327, 328; 326/68, 81–83, 82; 330/298

(56) References Cited

U.S. PATENT DOCUMENTS

| | | | | |
|---|---|---|---|---|
| 5,744,982 A | * | 4/1998 | Chu | 326/83 |
| 6,023,174 A | * | 2/2000 | Kirsch | 326/81 |
| 6,400,189 B2 | * | 6/2002 | McDaniel | 327/108 |
| 6,483,349 B2 | * | 11/2002 | Sakata et al. | 326/83 |
| 6,483,386 B1 | * | 11/2002 | Cress et al. | 330/298 |
| 6,552,569 B2 | * | 4/2003 | Wert | 327/77 |
| 6,611,157 B2 | * | 8/2003 | Usui | 327/112 |

* cited by examiner

*Primary Examiner*—Long Nguyen
(74) *Attorney, Agent, or Firm*—Law Office of Dale B. Halling LLC

(57) ABSTRACT

An input buffer circuit has a pass gate circuit coupled to an input. A pseudo-differential amplifier is coupled to the pass gate circuit. A level shifter is coupled to the pseudo-differential amplifier.

11 Claims, 4 Drawing Sheets

10
Input Clipping Circuit
12
$V_{IN}$
14
Pseudo Differential Amplifier
16
$V_{ref}$
17
18
20

30
INPUT
PBIAS
NBIAS
INP
INN
Input Clipping Circuit
VEXT
VINT
VGND
VREF
OUTPUT (V)
NBIAS
1.4V
Vtn
VINT - |Vtp|
322
321
INPUT
INI
320
ACTUAL TRIP POINT REGION
Vin
(V)

(V)
PBIAS + VTP
NBIAS - VTN
Vil
224
IDEAL TRIP POINT
INP
INPUT
INPUT DEAD ZONE
220
INN
222
ACTUAL TRIP POINT REGION
Vin
(V)

INPUT BUFFER CIRCUIT

FIELD OF THE INVENTION

The present invention relates generally to the field of electronic circuits and more particularly to an input buffer circuit.

BACKGROUND OF THE INVENTION

Semiconductor processing techniques are constantly improving and as they improve the required power supply voltages are reduced. The best semiconductor processing techniques today only require power supply voltages of around 1.8 volts. These processing techniques create transistors commonly referred to as thin oxide transistors. Thin oxide transistors are faster and can be used to produce denser circuits. Unfortunately, thin oxide circuits commonly have to interface with older technology circuits that have high voltage power supplies (e.g., 2.5V, 3.0V or 3.3V). These high voltage circuits contain transistors commonly referred to as thick oxide transistors. When it is necessary to convert a signal from a high voltage to a low voltage, a buffer circuit is required. Prior art solutions use a buffer circuit that has both thick oxide transistors (components) and thin oxide transistors (components). As a result, the processing of these circuits is relatively complex and expensive. Creating a buffer circuit with transistors that are all thin oxide transistors is difficult since the gate oxide voltage stress limit of the thin oxide transistors is lower than the high voltages being applied from an external source. Another problem is creating an input buffer circuit with thin oxide transistors that does not consume supply current.

Thus there exists a need for an input buffer system that overcomes these problems.

SUMMARY OF INVENTION

An input buffer circuit includes a pass gate circuit coupled to an input. A pseudo-differential amplifier is coupled to the pass gate circuit. A level shifter is coupled to the pseudo-differential amplifier. Note that a pseudo-differential amplifier as used herein means a circuit that responds like a classical differential amplifier when the input voltage is in a range near a reference voltage on the other input, but that acts like a logic gate inverter when the input voltage is at a logic high or a logic low level. The reason for using the pseudo-differential amplifier is so the circuit does not consume supply current when the input voltage is at a logic high or logic low level. A classical differential amplifier would consume current under those circumstances.

In one embodiment an inverter is coupled to an output of the level shifter. In another embodiment, the pass gate circuit is formed with transistors that are all the thin oxide type transistors. In another embodiment, the pass gate circuit has a bias input.

In one embodiment, the pseudo differential amplifier does not consume supply current when an input to the pass gate circuit is at a high logic level. In another embodiment, the pseudo differential amplifier has a capacitor between a gate of a p-channel transistor and a gate of an n-channel transistor. In another embodiment, the pseudo differential amplifier has an isolation transistor. In one embodiment, the input buffer circuit has a low threshold pass gate transistor. This may be a native transistor in one embodiment. A pseudo differential amplifier is coupled to the low threshold pass gate transistor. In another embodiment, the pseudo differential amplifier is formed with devices that are all thin oxide devices. In another embodiment, the pseudo differential amplifier has a first p-channel transistor and a second p-channel transistor. The first p-channel transistor has a source coupled to a low voltage supply and the second p-channel transistor has a source coupled to a low voltage supply. In another embodiment, the pseudo differential amplifier has a first n-channel transistor that has a drain coupled to a drain of the first p-channel transistor and a second n-channel transistor that has a drain coupled to a drain of the second p-channel transistor. In yet another embodiment, the pseudo differential amplifier has a third n-channel transistor that has a source coupled to a ground and a drain that is coupled to a source of the first n-channel transistor and to a source of the second n-channel transistor. In one embodiment, a gate of the first p-channel transistor and a gate of the first n-channel transistor and a gate of the third n-channel transistor are coupled to an output of the low threshold pass gate transistor.

In one embodiment, the pseudo differential amplifier does not consume supply current when the input buffer is in a standby mode.

In one embodiment, the input buffer circuit has an input clipping circuit. A pseudo differential amplifier is coupled to the input clipping circuit. An inverter is coupled to the pseudo differential amplifier. In one embodiment, the input buffer circuit includes a level shifter coupled between the pseudo differential amplifier and the inverter.

In one embodiment, the input clipping circuit only has thin oxide transistors. In another embodiment, the input clipping circuit has a p-channel pass gate transistor and an n-channel pass gate transistor. In another embodiment, the input clipping circuit has a p-bias input and an n-bias input.

In one embodiment, the pseudo differential amplifier has an isolation transistor.

DETAILED DESCRIPTION OF THE DRAWINGS

Figure 1:
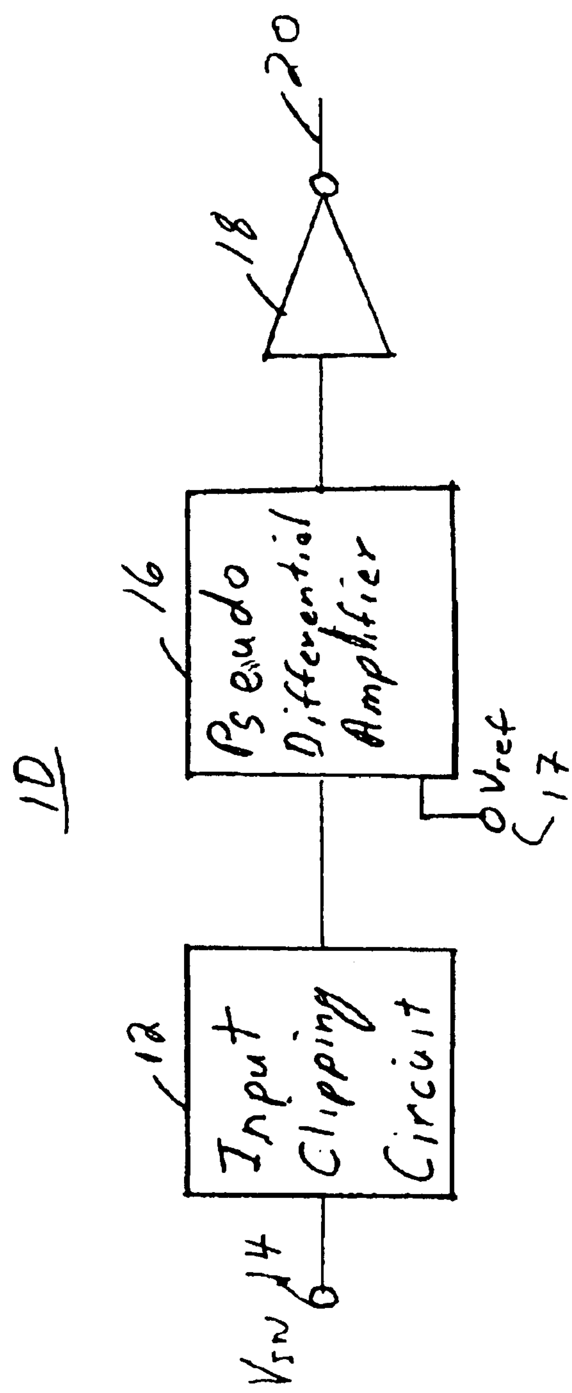
FIG. 1 is a block diagram of an input buffer circuit in accordance with one embodiment of the invention.

FIG. 1 is a block diagram of an input buffer circuit 10 in accordance with one embodiment of the invention. The circuit 10 includes an input clipping circuit 12 coupled to an input signal (Vin) 14. A pseudo-differential amplifier 16 is coupled to the input clipping circuit 12 and a reference voltage input (Vrep) 17. Note that a pseudo-differential amplifier as used herein means a circuit that responds like a classical differential amplifier when the input voltage is in a range near a reference voltage on the other input, but that acts like a logic gate inverter when the input voltage is at a logic high or a logic low level. The reason for using the pseudo-differential amplifier is so the circuit does not consume supply current when the input voltage is at a logic high or a logic low level. A classical differential amplifier would consume current under those circumstances. The pseudo-differential amplifier 16 is coupled to an inverter 18. The inverter 18 has an output 20.

Figure 2:
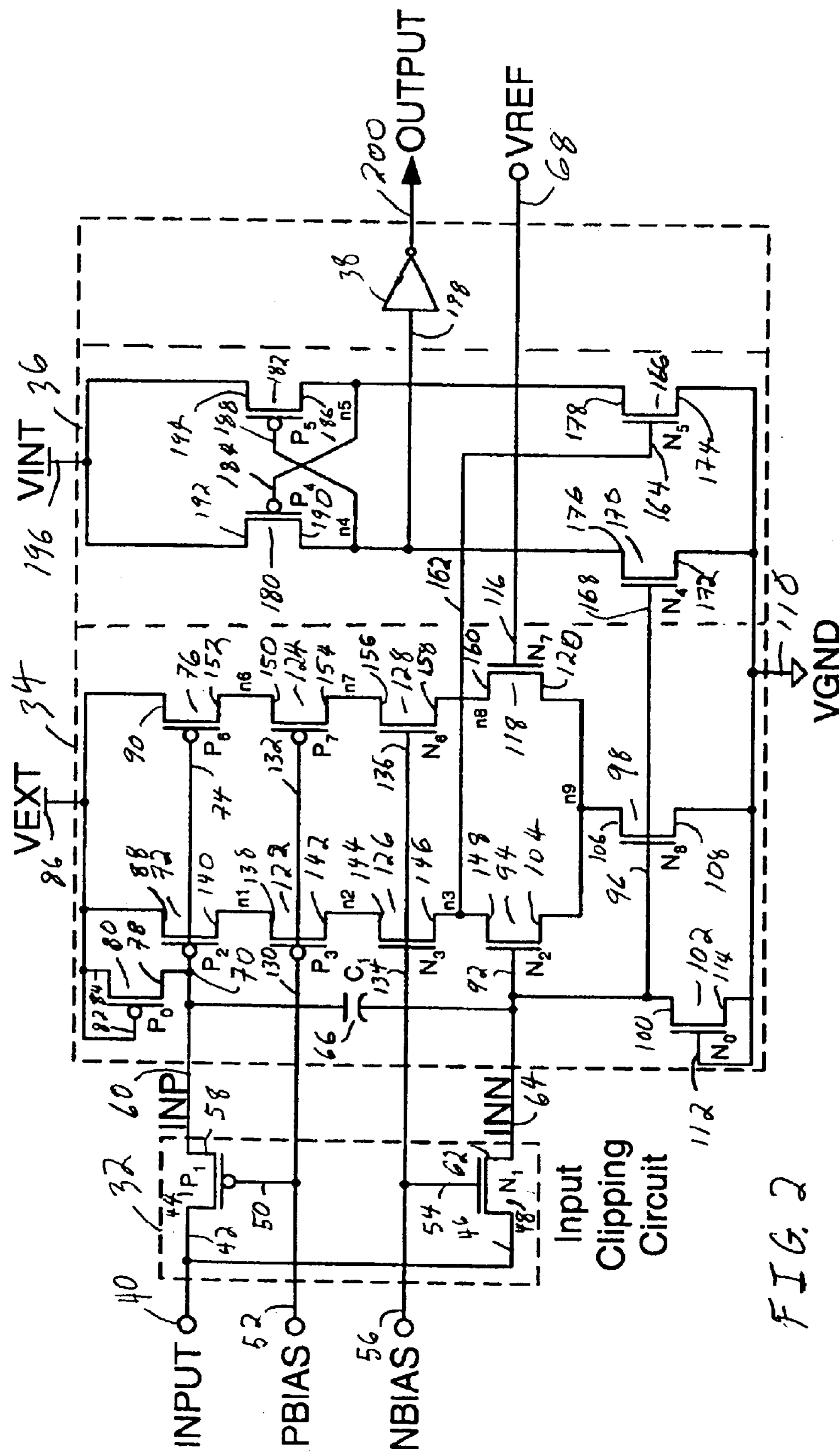
FIG. 2 is a circuit diagram of an input buffer circuit in accordance with one embodiment of the invention.

FIG. 2 is a circuit diagram of an input buffer circuit 30 in accordance with one embodiment of the invention. The circuit 30 is similar to the circuit 10 of FIG. 1. The circuit 30 has four major components: an input clipping circuit 32 or pass gate circuit; a pseudo-differential amplifier circuit 34; a level shifter 36; and an inverter 38. The input clipping circuit 32 has an input 40 coupled to a source 42 of a first p-channel transistor (P1) 44 and a drain 46 of a first n-channel transistor (N1) 48. A gate 50 of the p-channel transistor 44 is coupled to a p-channel bias signal (PBIAS) 52. A gate 54 of the n-channel transistor 48 is coupled to a n-channel bias signal (NBIAS) 56. The drain 58 of transistor 44 is coupled to an input (INP) 60 of the pseudo-differential amplifier circuit 34. The source 62 of transistor 48 is coupled to an input (INN) 64 of the pseudo-differential amplifier circuit 34. A capacitor (C1) 66 is coupled between the inputs INP 60 and INN 64, in one embodiment.

The input to the pseudo-differential amplifier 34 includes a reference voltage input 68 and a second input formed by INP 60 and INN 64. The second input is split into two separate inputs to protect the thin oxide transistors. The p-channel input INP 60 is coupled to a gate 70 of a second p-channel transistor (P2) 72 and a gate 74 of a sixth p-channel transistor (P6) 76. The input INP 60 is also coupled to a drain 78 of a zero p-channel transistor (P0) 80. The gate 82 and the source 84 of transistor 80 are coupled to a high voltage power supply VEXT 86. The source 88 of transistor 72 and the source 90 of transistor 76 are coupled to VEXT 86. The n-channel input INN 64 is coupled to the gate 92 of the second n-channel transistor (N2) 94, the gate 96 of the eighth n-channel transistor (N8) 98 and to the drain 100 of the zero n-channel transistor (N0) 102. The source 104 of transistor 94 is coupled to the drain 106 of transistor 98. The source 108 of transistor 98 is coupled to ground VGND 110. The gate 112 and the source 114 of transistor 102 are coupled to VGND 110. The input VREF 68 is coupled to the gate 116 of the seventh n-channel transistor (N7) 118. The source 120 of transistor 118 is coupled to the drain 106 of transistor 98.

The pseudo-differential amplifier 34 requires a plurality of isolation transistors to avoid exceeding the gate oxide limit of any of the thin oxide transistors used to form the pseudo-differential amplifier 34. The isolation transistors are the third p-channel transistor (P3) 122, the seventh p-channel transistor (P7) 124, the third n-channel transistor (N3) 126 and the sixth n-channel transistor (N6) 128. The gate 130 of transistor 122 and the gate 132 of transistor 124 are coupled to the PBIAS signal 52. The gate 134 of transistor 126 and the gate 136 of transistor 128 are coupled to the NBIAS signal 56. The source 138 of transistor 122 is coupled to the drain 140 of transistor 72. The drain 142 of transistor 122 is coupled to the drain 144 of transistor 126. The source 146 of transistor 126 is coupled to the drain 148 of transistor 94. The source 150 of transistor 124 is coupled to the drain 152 of transistor 76. The drain 154 of transistor 124 is coupled to the drain 156 of transistor 128. The source 158 of transistor 128 is coupled to the drain 160 of transistor 118.

The output 162 of the pseudo-differential amplifier circuit 34 is coupled to the drain 148 of transistor 94 and the source 146 of transistor 126. The output 162 is coupled to the level shifter 36. A gate 164 of the fifth n-channel transistor (N5) 166 of the level shifter 36 is coupled to the output 162. The input INN 64 is coupled to the gate 168 of the fourth n-channel transistor (N4) 170. The source 172 of transistor 170 and the source 174 of transistor 166 are coupled to VGND 110. The drains 176, 178 of transistors 170, 166 are coupled to a pair of p-channel cross coupled transistors (P4, P5) 180, 182. The gate 184 of transistor 180 is coupled to the drain 186 of transistor 182. The gate 188 of transistor 182 is coupled to the drain 190 of transistor 180. The sources 192, 194 of transistors 180, 182 are coupled to a low voltage power supply (VINT) 196. The input 198 of inverter 38 is coupled to the drain 190 of transistor 180. The output 200 forms the output of the circuit 30.

The input 40 is coupled to two pass transistors (P1, N1) 44, 48. When the input 40 is high (VEXT) the output INP 60 is going to be VEXT and the output INN 64 is going to be NBIAS less a Vtnl (n-channel threshold N1). The transistor 72 coupled to the input INP 60 will turn off. The transistor 94 and transistor 98 are coupled to input INN 64 and are on. This couples the output 162 to VGND 110. As a result the output 162 of the pseudo-differential amplifier is low. The output 162 is coupled to transistor 166 of the level shifter 36. Since the output 162 is low, the transistor 166 is off. Transistor 170 of the level shifter 36 is coupled to the input INN 64, which is high. As a result, transistor 170 is on and couples the input 198 of the inverter 38 to VGND 110, which results in the output 200 of the circuit 30 to be high.

When the input 40 is low (VGND) the output INP 60 is going to be PBIAS plus a |Vtp1| (p-channel threshold P1) and the output INN 64 is going to be VGND 110. The transistor 94 will be off since it is coupled to input INN 64. The transistors 72 and 76 will be on since JNP is low. Transistor 122 will be on and therefor the drain 144 of transistor 126 will see a voltage of VEXT. The source 146 of transistor 126 will pull up to approximately the voltage of NBIAS-Vtn3, since the transistor 94 is off. The output 162 of the pseudo-differential amplifier 34 will then be approximately NBIAS-Vtn3, which will turn on transistor 166. Transistor 166 couples VGND 110 to the gate 184 of transistor 180, turning on transistor 180. Transistor 180 then couples the input 198 to VINT 196 or a high. As will be apparent to those skilled in the art the circuit does not consume current when the input 40 is at a logic high or logic low level. For a logic high input, transistors 72 & 76 are off so no current is consumed by the pseudo-differential amplifier 34. The transistors 166 and 180 are off in the level shifter 36, so no current is consumed by the level shifter. For a logic low input, transistor 98 is off so no current is consumed by the pseudo-differential amplifier 34. The transistor 170 and 182 are off in the level shifter 36, so no current is consumed by the level shifter.

The circuit 30 also needs to protect the gate oxides of the thin oxide transistors while having a trip point in the specified region. In order for the circuit to work, the NBIAS input 56 must have a voltage greater than 2Vtn (n-channel threshold) plus $V_{gsn2}$ (VNBIAS>2*Vtn+$V_{gsn2}$), where $V_{gsn2}$ is the gate overdrive of transistor (N2) 94. In order to protect the gate oxide of the n-channel transistors, NBIAS 56 must have a voltage that is less than the gate oxide stress limit. Similarly for the circuit to work, the PBIAS input 52 must have a voltage less than VEXT (high voltage power supply) less |2Vtp| (p-channel threshold) less $|V_{gsp2}|$ (VPBIAS<VEXT−|2*Vtp|−$|V_{gsp2}|$), where $V_{gsp2}$ is the gate overdrive of transistor (P2) 72. In order to protect the gate oxide of the p-channel transistors, PBIAS 52 must have a voltage greater than VEXT less the gate oxide stress limit.

The above description defines the required ranges for the bias voltages to ensure both functionality and oxide protection. However, depending on the external supply voltage VEXT and the threshold voltages Vtn and Vtp, an input dead zone region may exist. The input dead zone region 220 (see FIG. 4) is defined as an input voltage region where both the internal input INN 64 and INP 60 do not change. The trip point region 222 (see FIG. 4) of the circuit must be outside the dead zone region 220 but above the Vil 224 specification. The trip point region is shifted above Vil 224 by the transistors 76, 124, 128, 118 and 98. As the input 40 rises from 0V to Vtn the n-channel transistors 94 and 98 remain cut-off and the output 162 remains high. As the input 40 rises above a Vtn the transistors 94 and 98 begin to conduct. For this conduction the transistor 98 must sink current from both legs. This forces the drain 106 to increase in voltage and reduces the gate to source voltage of transistor 94. This action requires the input voltage to be higher before the output 162 will change state. As a result, the circuit trip point is raised. The minimum trip point voltage is raised, which gives more margin to the Vil 224 specification.

The capacitor 66 is included to reduce the skew in the output transitions. The propagation delay through the input buffer will be different depending on the input transition. The capacitor 66 reduces this skew by coupling the two internal inputs (INN,INP) together during a transition. This acts to remove the dead zone region during transient operation. The size of the capacitor needs to selected carefully, since too much coupling could cause the transistors' oxides to be over stressed.

Transistors 102 and 80 are included to prevent the internal nodes INN 64 and INP 60 from floating too low or high and over stressing the transistor oxides.

The circuit 30 protects the thin oxide devices and provides a desirable trip point. In addition, the circuit 30 does not consume supply current when the input is near the rails (standby mode). This makes the circuit desirable for portable applications.

Figure 3:
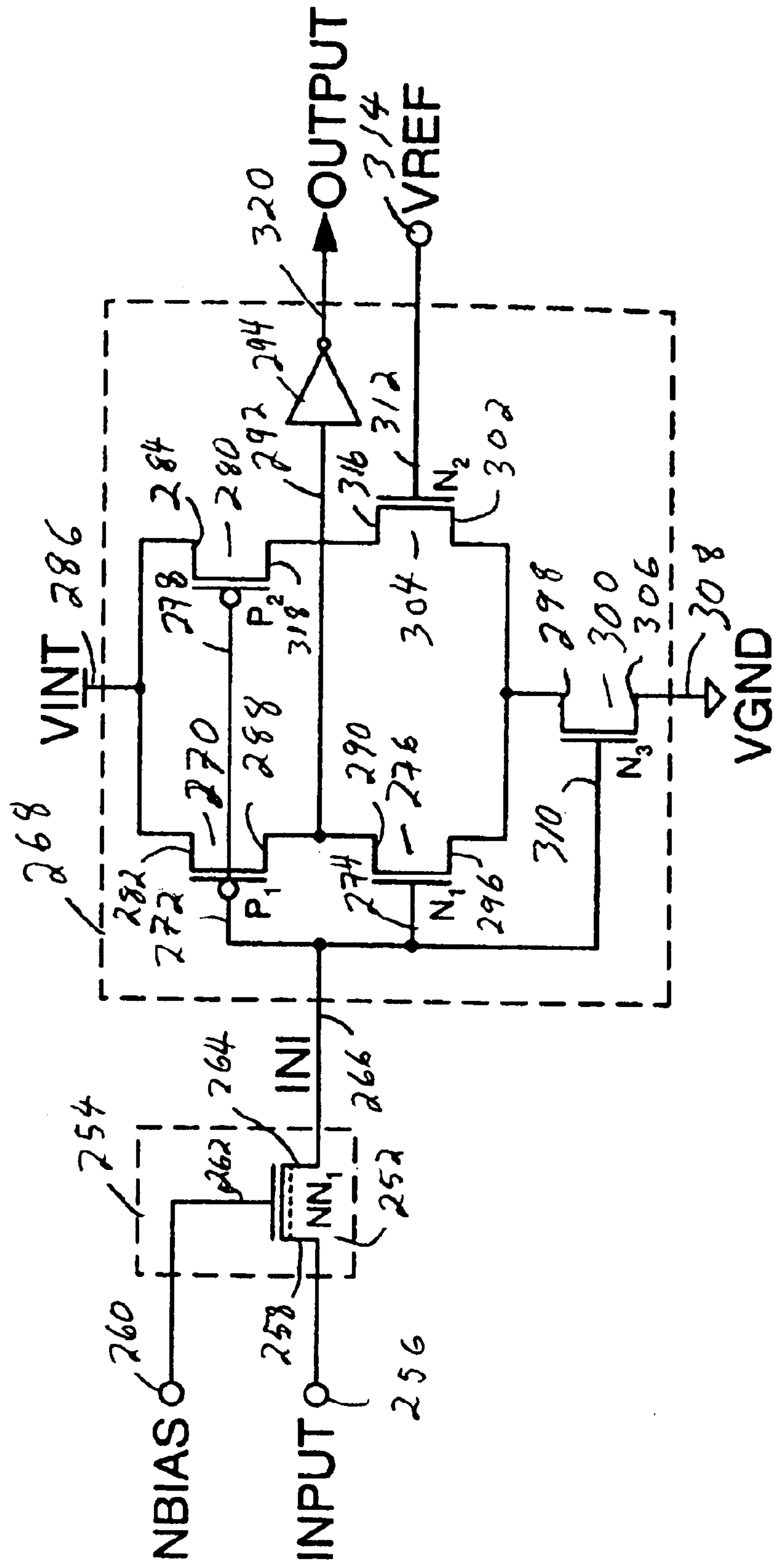
FIG. 3 is a circuit diagram of an input buffer circuit in accordance with one embodiment of the invention.

FIG. 3 is a circuit diagram of an input buffer circuit 250 in accordance with one embodiment of the invention. The difference between the circuit 30 of FIG. 2 and the circuit 250 of FIG. 3 is that a low threshold or native transistor is available. A native transistor (NN2) 252 performs the function of the input clipping circuit 254. An input signal 256 is coupled to a drain 258 of the pass gate transistor 252. A bias signal (NBIAS) 260 is coupled to the gate 262 of the is transistor 252. The source 264 is coupled to the input INI 266 of the pseudo-differential amplifier 268. The pseudo-differential amplifier 268 has a first p-channel transistor (P1) 270 with its gate 272 coupled to the input INI 266. A gate 274 of a first n-channel (N1) transistor 276 and a gate 278 of a second p-channel transistor 280 are coupled to the input INI 266 also. The source 282 of transistor 270 and the source 284 of transistor 280 are coupled to the internal or low voltage power supply VINT 286. The drain 288 of transistor 270 is coupled to the drain 290 of transistor 276 and the input 292 of inverter 294. The source 296 of transistor 276 is coupled to the drain 298 of a third n-channel transistor (N3) 300 and to the source 302 of a second n-channel transistor (N2) 304. The source 306 of transistor 300 is coupled to ground VGND 308. The gate 310 of transistor 300 is coupled to the input INI 266. The gate 312 of transistor 304 is coupled to the input VREF 314. The drain 316 of transistor 304 is coupled to the drain 318 of transistor 280. The output 320 of the inverter 294 is the output of the circuit 250.

When the input signal 256, a high voltage signal, is high the pass gate 252 clips the signal to a voltage equal to the voltage of the NBIAS signal 260. In one embodiment, the NBIAS signal 260 is equal to the VINT voltage 286. As a result, the input INI 266 has a high logic level, VINT in one embodiment, this turns off transistor 270 and transistor 280. Transistor 276 is turned on, as is transistor 300. As a result the output 292 is coupled to VGND 308. Since the input 292 to inverter 294 is low, the output 320 of the inverter is high. When the input signal 256 is low, the source 264 of transistor 252 is low. This turns off transistor 276 and the transistor 300. This turns on transistor 270 and transistor 280. As a result, the input 292 of inverter 294 is coupled to VINT 286, a logic high. The output 320 of inverter 294 is a logic low. Note that transistor 300 prevents any current from flowing when the input 256 is low and the transistors 270 and 280 prevent any current from flowing when the input 256 is high. Thus, the pseudo-differential amplifier does not consume current in standby mode (input 256 logic high or logic low).

Figures 4, 5:
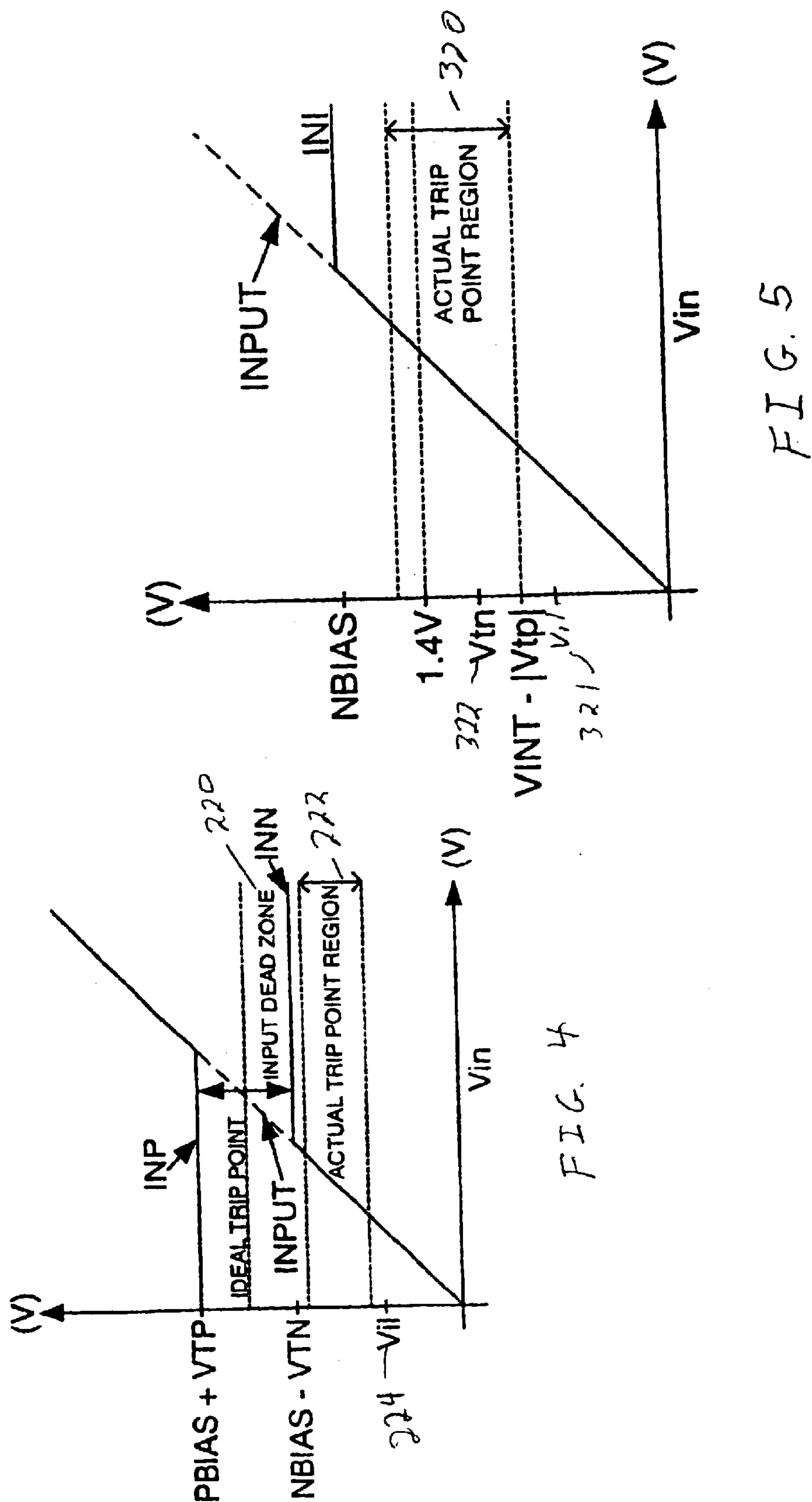
FIG. 4 is a graph of the operation of an input buffer circuit of FIG. 2 in accordance with one embodiment of the invention.
FIG. 5 is a graph of the operation of an input buffer circuit of FIG. 3 in accordance with one embodiment of the invention.

The native transistor 252, which may be a low threshold transistor, clips the input voltage to provide gate oxide protection for the transistors in the pseudo-differential amplifier 268. This allows the pseudo-differential amplifier 268 to be powered by the low voltage power supply and to use transistors that are the thin oxide type transistors. The intent of transistors 280, 304, and 300 is to force the drain 298 of transistor 300 high as the input voltage is raised from a low voltage to a high voltage. As the input rises from 0V to Vtn, the n-channel devices 276 and 300 remain cut-off and the output 320 remains low. As the input rises above a Vtn, the transistors 276 and 300 begin to conduct. For this condition, the transistor 300 must sink current from both legs of the pseudo-differential amplifier 268. This forces the drain 298 of transistor 300 to increase in voltage and reduces the gate to source voltage of transistor 276. As a result, the input voltage 256 must be higher before the output will change state. This effectively increases the trip point region 320 (see FIG. 5) of the circuit 250. This raises the trip point voltage, which gives more margin to the Vil specification 321. Also, the inclusion of the second leg, including 280 and 304, and the reference voltage input 314 gives more control on the maximum input high trip point voltage. Thus, the circuit increases the noise margin to the Vil specification 321 and tightens the trip point region. FIG. 5 shows that the trip point region 320 includes a section above the n-channel threshold Vtn 322. This occurs since the transistor 276 remains in weak inversion for input voltages above a Vtn due to the action of transistor 300. The circuit results in increasing the weak inversion region for the p and n channel transistors and the trip point occurs in this region.

The circuit 250 protects the thin oxides devices and provides a desirable trip point. In addition, the circuit 250 does not consume current when the input is near the power supply Vint 286 or the ground supply VGND 308 (standby mode). This makes the circuit desirable for portable applications.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. An input buffer circuit, comprising:

a pass gate circuit coupled to an input;

a pseudo-differential amplifier coupled to the pass gate circuit wherein the pseudo differential amplifier includes a capacitor coupled between a gate of a p-channel transistor and a gate of an n-channel transistor and wherein the pseudo differential amplifier does not consume supply current when the input to the pass gate circuit is at a high logic level; and a level shifter coupled to the pseudo-differential amplifier.

2. The circuit of claim 1, further including an inverter coupled to an output of the level shifter.

3. The circuit of claim 1, wherein the pass gate circuit includes transistors that are all low voltage type transistors.

4. The circuit of claim 3, wherein the pass gate circuit has a bias input.

5. The circuit of claim 1, wherein the pseudo differential amplifier has an isolation transistor.

6. An input buffer circuit, comprising:

a native pass gate transistor; and a pseudo differential amplifier coupled to the native pass gate transistor wherein the pseudo differential amplifier has a first p-channel transistor and a second n-channel transistor the first p-channel transistor having a source to a low voltage supply and the second p-channel transistors having a source coupled to the low voltage supply, a first n-channel transistor having a drain coupled to a drain of the first p-channel transistor and a second n-channel transistor having a drain coupled to a drain of the second p-channel transistor, a third n-channel transistor having a source coupled to a ground and a drain coupled to a source of the first n-channel transistor and to a source of the second n-channel transistor, where a gate of the first p-channel transistor and a gate of the first n-channel transistor and a gate of the third n-channel transistor are coupled to an output of the native pass gate transistor, wherein all the transistors forming the pseudo differential amplifier are low voltage type transistors.

7. The circuit of claim 6, wherein the pseudo differential amplifier does not consume supply current when the input buffer is in a standby mode.

8. An input buffer circuit, comprising:

an input clipping circuit wherein the input clipping circuit includes transistors that are all thin oxide type transistors and has a p-channel pass gate transistor and an n-channel pass gate transistor;

a pseudo differential amplifier coupled to the input clipping circuit; and an inverter coupled to the pseudo differential amplifier.

9. The circuit of claim 8, further including a level shifter coupled between the pseudo differential amplifier and the inverter.

10. The circuit of claim 9, wherein the input clipping circuit has a p-bias input and an n-bias input.

11. The circuit of claim 8, wherein the pseudo differential amplifier has an isolation transistor.

* * * * *